(12) United States Patent
Recchia

(10) Patent No.: US 8,098,270 B2
(45) Date of Patent: *Jan. 17, 2012

(54) METHOD OF CREATING A DIGITAL MASK FOR FLEXOGRAPHIC PRINTING ELEMENTS IN SITU

(76) Inventor: David Recchia, Smyrna, GA (US)

( * ) Notice: Subject to any disclaimer, the term of this patent is extended or adjusted under 35 U.S.C. 154(b) by 434 days.

This patent is subject to a terminal disclaimer.

(21) Appl. No.: 12/413,753

(22) Filed: Mar. 30, 2009

(65) Prior Publication Data

US 2009/0186303 A1 Jul. 23, 2009

Related U.S. Application Data

(63) Continuation of application No. 11/333,022, filed on Jan. 17, 2006, now Pat. No. 7,531,285.

(51) Int. Cl.
*B41J 2/435* (2006.01)

(52) U.S. Cl. ........................................ 347/228

(58) Field of Classification Search ................. 347/228, 347/212, 213, 216, 218, 153, 156, 140, 101; 430/336, 330, 320, 269, 203, 200
See application file for complete search history.

(56) References Cited

U.S. PATENT DOCUMENTS

| | | | |
|---|---|---|---|
| 3,264,103 A | 8/1966 | Cohen et al. | |
| 4,556,309 A | 12/1985 | Weber et al. | |
| 5,001,036 A | 3/1991 | Choi | |
| 5,141,915 A | 8/1992 | Roenigk et al. | |
| 5,175,072 A | 12/1992 | Martens | |
| 5,262,275 A | 11/1993 | Fan | |
| 5,279,697 A | 1/1994 | Peterson et al. | |
| 5,312,683 A | 5/1994 | Chou et al. | |
| 5,372,985 A | 12/1994 | Chang et al. | |
| 5,372,987 A | 12/1994 | Fisch et al. | |
| 5,409,883 A | 4/1995 | Larshus et al. | |
| 5,506,086 A | 4/1996 | Van Zoeren | |
| 5,589,433 A | 12/1996 | Morrison et al. | |
| 5,719,009 A | 2/1998 | Fan | |
| 5,764,268 A | 6/1998 | Bills et al. | |
| 5,766,819 A | 6/1998 | Blanchet-Fincher | |
| 5,840,463 A | 11/1998 | Blanchet-Fincher | |
| 5,856,061 A | 1/1999 | Patel et al. | |
| 5,856,064 A | 1/1999 | Chou | |
| 6,001,530 A | 12/1999 | Kidnie et al. | |
| 6,171,735 B1 | 1/2001 | Li et al. | |
| 6,204,874 B1 | 3/2001 | Michelson | |
| 6,238,837 B1 | 5/2001 | Fan | |
| 6,551,759 B2 | 4/2003 | Daems et al. | |
| 6,773,859 B2 | 8/2004 | Fan et al. | |
| 6,855,474 B1 | 2/2005 | Kidnie et al. | |
| 6,894,713 B2 | 5/2005 | Moulin et al. | |
| 7,531,285 B2 * | 5/2009 | Recchia | ........................ 430/200 |
| 2003/0180655 A1 | 9/2003 | Fan et al. | |
| 2003/0211423 A1 | 11/2003 | Mengel et al. | |

FOREIGN PATENT DOCUMENTS

| | | |
|---|---|---|
| EP | 1 239 329 A2 | 9/2002 |
| EP | 0 891 877 B1 | 1/2003 |
| WO | WO 01/18604 A2 | 3/2001 |
| WO | WO 01/88615 A1 | 11/2001 |

* cited by examiner

*Primary Examiner* — Kristal Feggins

(74) *Attorney, Agent, or Firm* — Carmody & Torrance LLP

(57) ABSTRACT

A method of creating a digital mask in situ for use in a process of making digital flexographic printing elements. The digital mask is created by laminating the negative image that is the by-product of a thermal proofer to a photosensitive printing plate. Thereafter, the photosensitive printing element can be imaged, exposed, and developed in the usual manner.

8 Claims, No Drawings

METHOD OF CREATING A DIGITAL MASK FOR FLEXOGRAPHIC PRINTING ELEMENTS IN SITU

This application is a continuation of U.S. application Ser. No. 11/333,022, filed Jan. 17, 2006, now U.S. Pat. No. 7,531,285, which is herein incorporated by reference in its entirety.

FIELD OF THE INVENTION

The present invention is directed to a new method of creating a digital mask in situ for use in a process of making digital flexographic printing elements. The digital mask is created by laminating the negative image that is the by-product of a thermal proofer to a photosensitive printing plate.

BACKGROUND OF THE INVENTION

Photosensitive printing elements typically comprise (a) a support layer; (b) one or more layers of photopolymerizable or photocurable material; and (c) optionally, a removable coversheet that protects the printing element during transport and handling. Processes for the creation of a relief image in the printing element are well known in the art. These processes can be divided into two general categories: (1) "conventional" methods in which a negative is contacted with a photocurable layer and the photocurable layer is exposed to actinic radiation through the negative; and (2) "digital" methods in which an in situ negative is formed directly on the photosensitive printing element. Digital methods have been increasingly studied as a means to go more quickly from plate to press.

Digital methods create a mask image in situ on or disposed above a photocurable layer of a photosensitive printing element. Generally, any thermally removable layer that is capable of blocking actinic radiation can be used to form the in situ mask image. The in situ mask image remains on the printing element for subsequent steps of imagewise exposure to actinic radiation and thermal development to create the relief image printing element.

Digital methods of creating the in situ mask image typically require one or more steps to prepare the photosensitive element prior to imagewise exposure. Generally, digital methods of in situ mask formation either selectively remove or transfer the radiation opaque layer, from or to a surface of the photosensitive element opposite the support. Preferably, the thermally removable layer is sensitive to infrared radiation in order to carry out the digital methods for forming the mask image with infrared laser radiation. Infrared laser exposure can be carried out using various types of infrared lasers, which emit in the range 750 to 20,000 nm, such as diode lasers emitting in the 780 to 2,000 nm range and Nd:YAG lasers emitting at 1064 nm.

Various methods currently exist for creating digital masks in situ. For example, the photosensitive element may initially include the thermally removable layer as a radiation opaque layer that covers or substantially covers the entire surface of the photopolymerizable layer. The radiation opaque layer is imagewise exposed to infrared laser radiation to selectively remove the radiation opaque layer and form the image on the photopolymerizable layer, i.e., the in situ mask. This process is described, for example, in U.S. Pat. Nos. 5,262,275, 5,719,009, and 6,238,837 to Fan and in U.S. Pat. No. 5,506,086 to Van Zoeren, the subject matter of each of which is herein incorporated by reference in its entirety.

In another method, the photosensitive element does not initially include the thermally removable layer. A separate element bearing the radiation opaque layer forms an assemblage with the photosensitive element such that the radiation opaque layer is adjacent to the surface of the photosensitive element opposite the support. (If present, a coversheet associated with the photopolymerizable layer is removed prior to forming the assemblage). The assemblage is exposed imagewise with infrared laser radiation to selectively transfer the radiation opaque layer and form the image on (or disposed above) the photopolymerizable layer. Examples of this process are described in U.S. Pat. No. 6,773,859 to Fan et al., in U.S. Pat. Nos. 5,766,819 and 5,840,463 to Blanchett, and in EP 0 891 877 A, the subject matter of each of which is herein incorporated by reference in its entirety.

Alternatively, the mask image may be created on a separate carrier and then transferred by application of heat and/or pressure to the surface of the photopolymerizable layer opposite the support. In this instance, the photopolymerizable layer is typically tacky and retains the transferred image. The separate carrier is removed from the element prior to imagewise exposure. The separate carrier may have a radiation opaque layer that is imagewise exposed to laser radiation to selectively remove the radiation opaque material and form the image. An example of this type of carrier is LaserMask® imaging film, available from Rexam, Inc. The image of radiation opaque material may also be transferred to the separate carrier from another element that has the radiation opaque material by means of laser radiation.

Finally, digital mask formation can be accomplished by imagewise application of the radiation opaque material by inkjet printing. Imagewise application of an ink-jet ink can be directly on the photopolymerizable layer or on another thermally removable layer (e.g., transparent layer) disposed above the photopolymerizable layer of the photosensitive element. In most cases, the maximum image resolution available through direct ink-jet masking of a photopolymerizable layer is lower to that available through other mask formation methods.

Although various methods exist for creating digital masks on photosensitive substrates, a need exists for improved methods that can more quickly and efficiently create a digital mask of the desired image resolution to further streamline the process of creating the relief image printing element.

The inventors of the present invention have surprisingly discovered that a negative donor image, which is the byproduct of a thermal proofer, may be used to create an in situ mask that can be laminated to the surface of a photosensitive printing element and processed in the normal manner to create the relief image printing element.

SUMMARY OF THE INVENTION

It is an object of the present invention to provide an improved method of creating a digital mask layer for imaging a photosensitive printing element.

To that end, the present invention is directed to a method of creating a digital mask for imaging a photosensitive printing element, comprising the steps of:

a) providing a donor element and a receptor element in a thermal proofer, wherein the donor element is capable of transferring material to the receptor element to create an image on the receptor element while retaining a negative of the image on the donor element;

b) outputting a desired image to a thermal proofer;

c) transferring material from the donor element to the receptor element to create the image;

d) separating the donor element from the receptor element and retaining the donor element; and e) laminating the donor element containing the negative image therein to a top surface of the photosensitive printing element.

Thereafter, the photosensitive printing element can be processed in the normal manner.

DETAILED DESCRIPTION OF THE PREFERRED EMBODIMENTS

The inventors of the present invention have surprisingly discovered that by laminating the donor image, that is, the negative image that is a by-product of a thermal proofer, to a photosensitive printing element, a new type of digital mask can be created.

The process of the invention typical includes the following steps.
- a) providing a donor element and a receptor element in a thermal proofer, wherein the donor element is capable of transferring material to the receptor element to create an image on the receptor element while retaining a negative of the image on the donor element;
- b) outputting a desired image to a thermal proofer;
- c) transferring material from the donor element to the receptor element to create the image;
- d) separating the donor element from the receptor element and retaining the donor element; and
- e) laminating the donor element containing the negative image therein to a top surface of the photosensitive printing element.

Thermal proofers are used to create color proofs for color matching prior to printing. Various thermal proofers are known in the art as described, for example in U.S. Pat. No. 6,855,474 to Kidnie et al, U.S. Pat. No. 6,204,874 to Michelson, U.S. Pat. No. 5,856,061 to Patel et al., and U.S. Pat. No. 5,372,987 to Fisch et al., the subject matter of each of which is herein incorporated by reference in its entirety. The process is described as thermal because it typically uses an IR laser to transfer the colors from the donor sheets to the substrate to be printed on (receptor element), using a different color for each donor sheet. The normal purpose of a thermal proofer is to perform color matching or testing on a substrate.

In an electronic printer or proofer, the image is in the form of a numerical file. Image data can be transferred to a transducer to enable conversion of that image into a thermal pattern through the use of a wire embedded head or a liquid crystal display which serves as a mask, or by other devices that change one form of informational energy to another. In systems using thermal transfer, a transducer allows the electronic file to be generated by heat in an imagewise manner. A donor element is in contact with a imagewise heated transducer and a receptor element allows color to be transferred imagewise from the donor element to the receptor element.

The image is formed by transferring a colorant (i.e. dye or pigment) from a donor element to a receptor element under the influence of energy from an energy source such as a thermal printhead or a laser. This transfer can be accomplished either by mass transfer or by dye transfer.

In the case of mass transfer, the majority of the material on the donor element (e.g., colorant, binder, and additives) is transferred to the receptor element. Typically, this can occur either by a melt mechanism or by an ablation mechanism. In a melt mechanism, the donor material is softened or melted and the softened or molten material flows across to the receptor. In an ablation mechanism, gases are typically generated that explosively propel the donor material across to the receptor, which results from at least partially volatilizing the binder or other additives in and/or under a layer of the donor material to generate propulsive forces to propel the colorant toward the receptor.

In a dye transfer system, only the colorant is transferred from the donor to the receptor. Thus, the colorant is transferred without binder or other additives. This can occur either by a diffusion mechanism or a sublimation mechanism.

The donor element typically comprises at least one colorant layer disposed on a substrate layer, which typically includes a colorant in combination with a binder, although a binder may not always be present. If present, the binder in a thermal mass transfer donor sheet is preferably a thermoplastic resin having a low glass transition temperature ($T_g$), i.e., generally less than about 100° C., or a low melting wax. These materials have a low enough melting or softening point that they are capable of transferring with the colorant to the receptor sheet. Examples of such binders include, but are not limited to, copolymers of vinyl chloride and vinyl acetate, butadiene and styrene copolymers, hydrocarbon waxes, epoxy resins, and chlorinated waxes. The binder in a thermal dye donor sheet is a thermoplastic resin with a Tg of about 25°-180° C., and preferably about 50°-160° C. Useful binders are those that do not transfer themselves but allow the colorant to diffuse, sublime, vaporize, melt, or melt-vaporize, etc. out of the colorant layer thereby leaving the binder on the donor sheet. Examples of such binders include, but are not limited to, copolymers of vinyl chloride and vinyl acetate, polyester resins, polyacrylates, polycarbonates, cellulose, polyvinyl chloride (PVC), chlorinated PVC.

The colorant can be a pigment, a stable dye, a polymeric dye, or any combination of these. It can be physically absorbed in the binder as when a dye is used. Alternatively, the colorant can be physically adsorbed to the binder as when a pigment is used, or chemically bound to the binder as occurs in a polymeric dye. Preferably the colorant is a dye such as azo, indoaniline, anthraquinone, styryl, cyanine, mesocyanine, phenolic, ketomethylene, tricyanostyryl, diazine, and oxazine.

The colorant layer can also include additives to help solubilize and stabilize the dye or pigment. These include polyurethanes, UV stabilizers, beat stabilizers, plasticizers, surfactants, silicones, low $T_g$ polymers (Tg no greater than about 80° C.), elastomers, etc.

The donor sheet can also include an antistick layer, i.e., a layer of a heat-resistant material that prevents the donor sheet from sticking to the thermal print head. The antistick layer is coated on the backside of the substrate, i.e., the side of the substrate opposite the side on which the colorant is coated. This backside coating of an antistick material can include a silicone, polyurethane, higher fatty acid, fluorocarbon resin, etc. Examples of materials used in antistick layers are described, for example, in U.S. Pat. No. 5,141,915 to Roenigk et al., the subject matter of which is herein incorporated by reference in its entirety.

The image-receiving layer on the receptor sheet is typically in direct contact with the donor colorant layer during thermal transfer imaging. It is designed to effectively receive an image from a donor sheet and to hold the image and yield a desired print with high optical image density, brightness, and stability. In a typical receptor sheet, the image-receiving layer can be bonded to the substrate through an intervening adhesive layer, or directly bonded to the substrate without such an adhesive layer. The image-receiving layer generally consists of a polymeric resin that has a strong affinity toward colorants, i.e., dyes and pigments. This image-receiving layer, when contacted intimately with a donor sheet under heat and pressure, receives the colorant that is transferred from the donor.

Suitable substrate layers for the donor element include, for example, plastic sheets and films such as polyethylene terephthalate, fluorene polyester polymers, polyethylene, polypropylene, acrylics, polyvinyl chloride and copolymers thereof and hydrolyzed and non-hydrolyzed cellulose acetate. The substrate needs to be sufficiently transparent to imaging radiation such as that emitted by a laser or laser diode to effect thermal transfer of the corresponding image to a receptor sheet. In a preferred embodiment, the substrate layer is polyethylene terephthalate (PET), which is typically from about 20 to 200 µm thick. If necessary, the substrate layer may be surface-treated so as to modify its wetability and adhesion to subsequently applied coatings. Such surface treatments include corona discharge treatment and the application of subbing layers or release layers. An example of a suitable release layer is polyvinyl alcohol.

Although it is generally preferable to use the donor image, the receptor image can also be used so long as it is in the negative form.

After the digital mask has been formed, the donor element is laminated to the photosensitive element using heat and pressure so that the negative image remaining on the donor element is contacted with the photocurable layer of the photosensitive element. Typically temperatures of between 120 and 140° C. and pressures between about 2 and 7 psi are used to ensure sufficient adhesion. Thereafter, the substrate layer of the donor element is removed.

The next step in the process is to overall expose the photosensitive element to actinic radiation through the donor element (in situ mask image). The actinic radiation exposure time can vary from a few seconds to minutes, depending upon the intensity and spectral energy distribution of the radiation, its distance from the photosensitive element, the desired image resolution, and the nature and thickness of the photopolymerizable composition. Exposure is of sufficient duration to crosslink the exposed areas down to the support layer or to the back exposed layer. Imagewise exposure time is typically much longer than backflash exposure time, and ranges from several to tens of minutes. Examples of suitable actinic radiation sources include both visible and UW sources, such as carbon arc, mercury-vapor arc, fluorescent lamps, electron flash units, electron beam units, lasers, and photographic flood lamps. In the case of digital masks, imagewise exposure to actinic radiation may be conducted in the presence or absence of atmospheric oxygen but is typically performed without the use of a vacuum.

A back exposure step may also be performed, which is a blanket exposure to actinic radiation through the support layer that is used to create a layer of polymerized (cured) material (i.e. floor layer), on the support side of the photopolymerizable layer and to sensitize the photopolymerizable layer. The floor provides improved adhesion between the photopolymerizable layer and the support, helps highlight dot resolution and also establishes the depth of the plate relief. Back exposure can take place before, after or during the other imaging steps, although it is preferably accomplished prior to the overall exposure to actinic radiation through the mask and the thermal development step. Any of the conventional radiation sources discussed above for the overall (imagewise) actinic radiation exposure step can be used for the back exposure step. Exposure time generally range from a few seconds up to a few minutes.

Next, the photosensitive printing element is thermally developed to reveal the relief image in the printing element. In this step, both the remaining portions of the donor element and the uncured portions of the photocurable layer are removed. Typically development comprises contacting the printing element with a solvent which will dissolve unexposed areas of photopolymer but leave exposed areas in tact. Various processes have been developed whereby photosensitive printing elements are prepared using heat and the differential melting temperature between cured and uncured photopolymer is used to develop the latent image. The basic parameters of this process are known, as described in U.S. Pat. Nos. 5,279,697, 5,175,072 and 3,264,103, in published U.S. patent publication Nos. US 2003/0180655, and U.S. 2003/0211423, and in WO 01/88615, WO 01/18604, and EP 1239329, the teachings of each of which are incorporated herein by reference in their entirety. These processes allow for the elimination of development solvents and the lengthy plate drying times needed to remove the solvent. and allow for use of the process in the manufacture of flexographic plates for printing newspapers and other publications where quick turnaround times and high productivity are important.

The development of the relief structure formed during the imaging step is accomplished by removal of the uncured portions of the radiation-curable layer. In the thermal development process, the radiation-curable layer is contacted with a heated web of absorbent material. The heat in the absorbent web is transferred to the radiation curable layer upon contact, and the temperature of the radiation-curable layer is raised to a temperature sufficient to enable the uncured portions of the radiation-curable layer to soften or liquefy and be absorbed into the absorbent web. While still in the heated condition, the absorbent sheet material is separated from the cured radiation-curable layer in contact with the support layer to reveal the relief structure.

Thereafter, the photosensitive printing elements can be uniformly post-exposed to ensure that the photopolymerization process is complete and that the element will remain stable during printing and storage. This post-exposure step can utilize the same radiation source as the main overall exposure. Detackification is another optional post-development treatment that can be applied if the surface of the photosensitive printing element is still tacky, such tackiness not generally being removed in post-exposure. Tackiness can be eliminated by methods well known in the art, such as treatment with bromine or chlorine solutions as is well known in the art.

While the invention has been particularly shown and described with respect to preferred embodiments thereof, it will be understood by those skilled in the art that changes in form and details may be made therein without departing from the scope and spirit of the invention.

What is claimed is:

1. A method of creating a digital mask for imaging a photosensitive printing element, comprising the steps of:
    a) providing a donor element wherein the donor element is capable of transferring material to a receptor thereby creating an image on the donor element;
    b) transferring material from the donor element to the receptor to create the image on the donor element;
    c) laminating the donor element containing the image to a top surface of the photosensitive printing element.

2. The method according to claim 1, further comprising the steps of exposing and developing the photosensitive printing element to reveal the relief image.

3. The method according to claim 2, wherein the donor sheet comprises a thermally transferable layer disposed on a backing layer.

4. The method according to claim 3, wherein the thermally transferable layer comprises a dye or pigment.

5. The method according to claim 4, wherein the thermally transferable layer further comprises at least one binder.

6. The method according to claim 3, comprising the step of removing the backing layer from the donor element prior to exposing and developing the printing element.

7. The method according to claim 2, wherein the exposing step comprises exposing the photosensitive printing element through the negative image of the donor sheet to actinic radiation to selectively cross-link and cure portions of the photosensitive printing element not covered by the donor element.

8. The method according to claim 2, wherein the developing step comprises thermally developing the photosensitive printing element to remove the donor element and the uncured portions of the photosensitive printing element.

* * * * *